(12) United States Patent
Chang et al.

(10) Patent No.: US 12,336,441 B2
(45) Date of Patent: Jun. 17, 2025

(54) RESISTIVE MEMORY DEVICE AND PREPARATION METHOD THEREOF

(71) Applicant: CHANGXIN MEMORY TECHNOLOGIES, INC., Hefei (CN)

(72) Inventors: Wei Chang, Hefei (CN); Jiefang Deng, Hefei (CN); Xiaoguang Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 471 days.

(21) Appl. No.: 17/807,030

(22) Filed: Jun. 15, 2022

(65) Prior Publication Data

US 2023/0008157 A1 Jan. 12, 2023

Related U.S. Application Data

(63) Continuation of application No. PCT/CN2022/076303, filed on Feb. 15, 2022.

(30) Foreign Application Priority Data

Jul. 9, 2021 (CN) .......................... 202110779767.9

(51) Int. Cl.
*H10B 63/00* (2023.01)
*H10N 70/00* (2023.01)
*H10N 70/20* (2023.01)

(52) U.S. Cl.
CPC .......... *H10N 70/253* (2023.02); *H10B 63/80* (2023.02); *H10N 70/066* (2023.02); *H10N 70/24* (2023.02); *H10N 70/8833* (2023.02)

(58) Field of Classification Search
CPC .... H10N 70/253; H10N 70/066; H10N 70/24; H10N 70/8833; H10B 63/80; H10B 63/30
See application file for complete search history.

(56) References Cited

U.S. PATENT DOCUMENTS

| | | |
|---|---|---|
| 8,395,139 B1 | 3/2013 | Ho et al. |
| 8,934,283 B2 | 1/2015 | Matsudaira et al. |
| 2020/0035915 A1 | 1/2020 | Reznicek et al. |
| 2021/0098460 A1* | 4/2021 | Lee .............. H10B 12/053 |
| 2021/0167129 A1 | 6/2021 | Reznicek et al. |

FOREIGN PATENT DOCUMENTS

| | | |
|---|---|---|
| CN | 103022037 B | 2/2016 |
| CN | 108899309 A | 11/2018 |
| CN | 112397508 A | 2/2021 |

OTHER PUBLICATIONS

International Search Report cited in PCT/CN2022/076303 mailed Apr. 1, 2022, 8 pages.
Pan, et al., "1Kbit FinFET Dielectric (FIND) RRAM in Pure 16nm FinFET CMOS Logic Process", 2015, IEEE, 4 pages.

* cited by examiner

*Primary Examiner* — David Vu
(74) *Attorney, Agent, or Firm* — Kilpatrick Townsend & Stockton LLP

(57) ABSTRACT

Embodiments of the present application relate to a resistive memory device and a preparation method thereof. The preparation method includes: providing a base; forming bit line trenches in the base; forming a resistive material layer on a sidewall and the bottom of the bit line trench; and forming a bit line structure in the bit line trench through filling, wherein a variable resistor structure includes the bit line structure and the resistive material layer.

19 Claims, 4 Drawing Sheets

RESISTIVE MEMORY DEVICE AND PREPARATION METHOD THEREOF

CROSS-REFERENCE TO RELATED APPLICATIONS

This is a continuation of International Application No. PCT/CN2022/076303, filed on Feb. 15, 2022, which claims the priority to Chinese Patent Application No. 202110779767.9, titled "RESISTIVE MEMORY DEVICE AND PREPARATION METHOD THEREOF" and filed with State Intellectual Property Office (SIPO) on Jul. 9, 2021. The entire contents of International Application No. PCT/CN2022/076303 and Chinese Patent Application No. 202110779767.9 are incorporated herein by reference.

TECHNICAL FIELD

Embodiments of the present application relate to the technical field of integrated circuits (ICs), and in particular, to a resistive memory device and a preparation method thereof.

BACKGROUND

A typical resistive memory device (RRAM) includes a planar transistor and a metal-insulator-metal (MIM) structure located above the planar transistor. The planar transistor and the MIM structure are prepared in different process steps, with a complex process procedure and large sizes. Therefore, how to simplify a process procedure of an RRAM and form a small-sized RRAM structure has become an urgent problem to be resolved.

SUMMARY

A preparation method of a resistive memory device includes:
  providing a base;
  forming bit line trenches in the base;
  forming a resistive material layer on a sidewall and a bottom of each of the bit line trenches; and
  forming a bit line structure in each of the bit line trenches through filling, wherein
  a variable resistor structure includes the bit line structure and the resistive material layer.

The present application further provides a resistive memory device, including:
  a base;
  bit line trenches, provided in the base;
  a resistive material layer, located on a sidewall and a bottom of each of the bit line trenches; and
  a bit line structure, filling each of the bit line trenches, wherein
  a variable resistor structure includes the bit line structure and the resistive material layer.

BRIEF DESCRIPTION OF THE DRAWINGS

To describe the technical solutions in the embodiments of the present application or in the related art more clearly, the following briefly describes the accompanying drawings is required for describing the embodiments or the related art. Apparently, the accompanying drawings in the following description show merely some embodiments of the present application, and those of ordinary skill in the art may still derive other drawings from these accompanying drawings without creative efforts.

DETAILED DESCRIPTION

Figure 1:
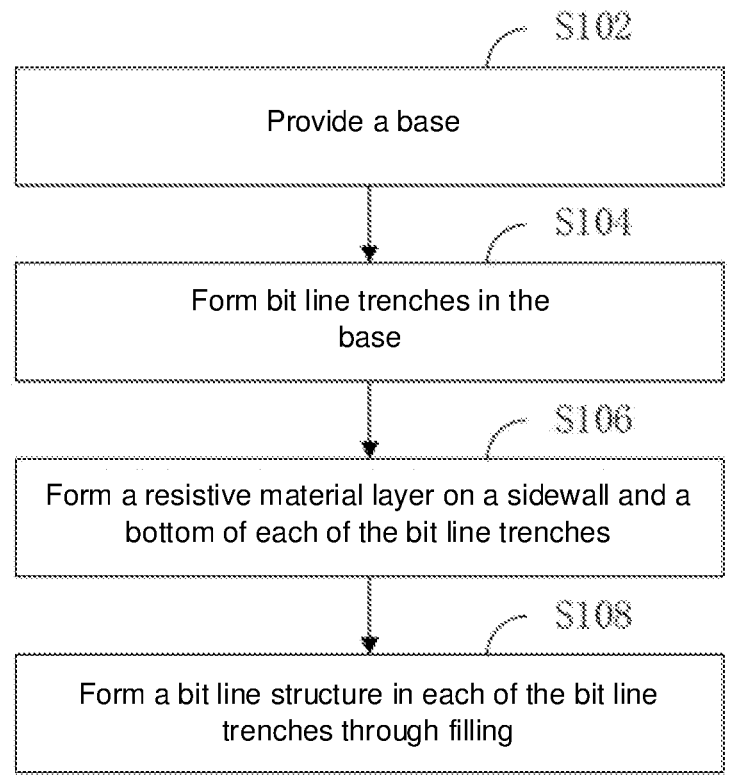
FIG. 1 is a schematic flowchart of a preparation method of a resistive memory device according to an embodiment.

To facilitate the understanding of embodiments of the present application, the embodiments of the present application are described more completely below with reference to the accompanying drawings. The preferred embodiments of the present application are shown in the accompanying drawings. However, the embodiments of the present application may be embodied in various forms without being limited to the embodiments described herein. On the contrary, these embodiments are provided to make the embodiments of the present application more thorough and comprehensive.

Unless otherwise defined, all technical and scientific terms used herein have the same meaning as commonly understood by those skilled in the technical field of the embodiments of the present application. The terms used in the specification of the embodiments of the present application are merely for the purpose of describing specific embodiments, and are not intended to limit the embodiments of the present application. The term "and/or" used herein includes any and all combinations of one or more of the associated listed items.

It should be understood that in the description of the embodiments of the present application, the terms such as "upper", "lower", "vertical", "horizontal", "inner", and "outer" indicate the orientation or position relationships based on the drawings. These terms are merely intended to facilitate description of the embodiments of the present application and simplify the description, rather than to indicate or imply that the mentioned device or element must have a specific orientation and must be constructed and operated in a specific orientation. Therefore, these terms should not be construed as a limitation to the embodiments of the present application.

It is understandable that the terms such as "first" and "second" used herein may be used to describe various elements, but these elements are not limited by these terms. Instead, these terms are merely intended to distinguish one element from another. For example, without departing from the scope of the present application, a first client may be referred to as a second client, and similarly, a second client may be referred to as a first client. Both the first client and the second client are clients, but they are not a same client.

In addition, the terms such as "first" and "second" are used only for descriptive purposes, and should not be construed as indicating or implying relative importance or implying the number of indicated technical features. Thus, features limited by "first" and "second" may expressly or implicitly include at least one of that feature. In the description of the present application, "multiple" means at least two, for example, two or three, unless otherwise expressly and specifically defined. In the description of the present application, "several" means at least one, for example, one or two, unless otherwise expressly and specifically defined.

A resistive memory device (Resistive Random Access Memory, RRAM) is a memory device of a non-charge memory mechanism and a metal-insulator-metal sandwich structure, and under specific voltage/current excitation, its resistance value may be converted between a high resistance state and a low resistance state, with advantages of low write operation voltage, short write erase time, long memory time, non-destructive reading, multi-value storage, simple structure, and high storage density, making it possible to replace DRAM, SRAM, Flash, and the like as a general-purpose memory. However, RRAM has a larger size and fewer RRAM cells per unit area. A typical RRAM cell using two FinFETs has a size of 0.07632 square microns.

Figure 2:
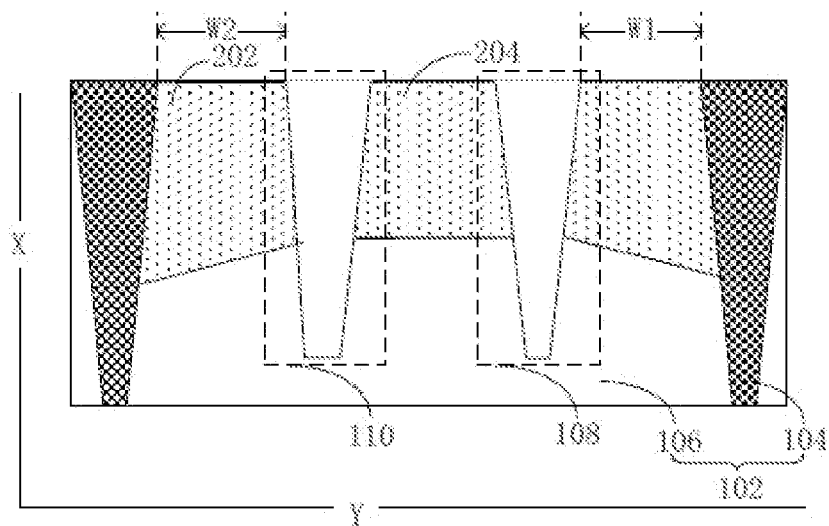
FIG. 2 is a schematic cross-sectional view of a resistive memory device after formation of a gate trench according to an embodiment.

FIG. 1 is a schematic flowchart of a preparation method of a resistive memory device according to an embodiment. FIG. 2 is a schematic cross-sectional view of a resistive memory device after formation of a gate trench 110 according to an embodiment. Referring to FIG. 1 and FIG. 2, in order to resolve the foregoing problem, in this embodiment, a preparation method of a resistive memory device is provided, including:

S102. Provide a base 102.

The base 102 for forming a resistive memory device is provided. Specifically, the base 102 includes a substrate and different device regions formed on the substrate. The substrate may be made of undoped monocrystalline silicon, impurity-doped monocrystalline silicon, silicon on insulator (SOI), stacked silicon on insulator (SSOI), stacked silicon-germanium on insulator (S-SiGeOI), silicon-germanium on insulator (SiGeOI), and germanium on insulator (GeOI), or the like. In an example, in this embodiment, monocrystalline silicon is selected as a constituent material of the substrate.

S104. Form bit line trenches 108 in the base 102.

The bit line trenches 108 are formed at preset positions of the base 102 by using photolithography and etching processes known to those skilled in the art.

S106. Form a resistive material layer 206 on a sidewall and a bottom of each of the bit line trenches 108.

Specifically, the resistive material layer 206 is formed on the sidewall and the bottom of each of the bit line trenches 108 by using any one of an atomic layer deposition process, a molecular-beam epitaxy process, a radio frequency magnetron sputtering process, and a chemical vapor deposition process. Under action of an additional electrical signal such as a voltage or a current, the resistive material layer 206 is reversibly transformed between different resistance states. The resistance states usually include two types: a is high resistance state and a low resistance state. It can be understood that, the resistive material layer 206 may be a high-k material layer. In one of the embodiments, the resistive material layer 206 includes at least one of a hafnium oxide material layer or a tantalum oxide material layer.

S108. Form a bit line structure 210 in each of the bit line trenches 108 through filling.

Specifically, the bit line structure 210 is formed in each of the bit line trenches 108 through filling, and a material of the bit line structure 210 may be a titanium nitride material or a tungsten metal material. In this case, the bit line structure 210 on one side of the resistive material layer 206, the base 102 on the other side of the resistive material layer 206, and the resistive material layer 206 jointly form a variable resistor structure (an MIM structure) of the resistive memory device, that is, the bit line structure 210 in the present application also serves as an electrode in the MIM structure and the resistive material layer 206 serves as a resistance transition layer in the MIM structure. This simplifies a process procedure.

In the foregoing resistive memory device, the variable resistor structure includes the bit line structure 210 and the resistive material layer 206. The resistive material layer 206 is located on the sidewall and the bottom of the bit line trench 108, and the bit line structure 210 fills the bit line trench 108. In the resistive memory device of the present application, the bit line structures 210 and the resistive material layer 206 on a bit line sidewall are used as part of the variable resistor structure, and the variable resistor structure is formed during the formation of the bit line structure 210, thereby simplifying a process procedure of the resistive memory device, reducing production costs, and reducing a size of the resistive memory device.

As shown in FIG. 2, in this embodiment, a shallow trench isolation structure 104 is formed in the base 102, and the shallow trench isolation structure 104 isolates active regions 106 arranged in an array in the base 102. During the formation of the bit line trenches 108 in the base 102, gate trenches 110 are formed in the base 102, each of the gate trenches 110 and one of the bit line trenches 108 cross a same active region 106 and the active region 106 is divided into a source region 202 located between the gate trench 110 and the shallow trench isolation structure 104 and a drain region 204 located is between the gate trench 110 and the bit line trench 108. Specifically, the bit line trenches 108 and the gate trenches 110 are simultaneously formed in the base 102 by using an etching process. One active region 106 has both the gate trench 110 and the bit line trench 108 passing through it, and the active region 106 is divided into the source region 202 located between the shallow trench isolation structure 104 and the gate trench 110 and the drain region 204 located between the gate trench 110 and the bit line trench 108. Subsequently, a doping process may be performed on the source region 202 and the drain region 204 according to actual needs, to respectively obtain a source and a drain of a transistor in the resistive memory device.

In other embodiments, the shallow trench isolation structure 104 is formed in the base 102, and the shallow trench isolation structure 104 isolates active regions 106 arranged in an array in the base 102. After the bit line trenches 108 are formed in the base 102, a step of forming gate trenches 110 in the base 102 is further included, wherein each of the gate trenches 110 and one of the bit line trenches 108 cross a same active region 106 and the active region 106 is divided into a source region 202 located between the gate trench 110 and the shallow trench isolation structure 104 and a drain region 204 located between the gate trench 110 and the bit line trench 108. Specifically, the bit line trenches 108 and the gate trenches 110 are separately formed in the base 102 by using an etching process. One active region 106 has both the gate trench 110 and the bit line trench 108 passing through it, and the active region 106 is divided into the source region 202 located between the shallow trench isolation structure 104 and the gate trench 110 and the drain region 204 located between the gate trench 110 and the bit line trench 108. Subsequently, a doping process may be performed on the source region 202 and the drain region 204 according to actual needs, to respectively obtain a source and a drain of a transistor in the resistive memory device.

In one of the embodiments, a doping depth of each of the source and the drain along a direction X is less than or equal to a depth of each of the gate trench 110 and the bit line trench 108. The direction X refers to a direction upward from the base 102. A direction Y refers to a direction intersecting with an extension direction of the bit line trench 108.

Still referring to FIG. 2, in one of the embodiments, the bit line trench 108 and the is gate trench 110 have a same depth in the direction X and a same width in the direction Y. In this case, the bit line trench 108 and the gate trench 110 may be formed by photolithography devices having a same overlay error. In other embodiments, the bit line trench 108 and the gate trench 110 have different shapes. In this case, the bit line trench 108 and the gate trench 110 are formed according to process requirements by photolithography devices having a same overlay error or different overlay errors.

As shown in FIG. 2, in one of the embodiments, while the bit line trench 108 and the gate trench 110 cross the same active region 106, there is an active region 106 between the bit line trench 108 and an adjacent shallow trench isolation structure 104 in the direction Y, that is, when one active region 106 has both the gate trench 110 and the bit line trench 108 passing through it, the active region 106 is divided into the source region 202 located between the shallow trench isolation structure 104 and the gate trench 110, the drain region 204 located between the gate trench 110 and the bit line trench 108, and part of the active region 106 located between the bit line trench 108 and the adjacent shallow trench isolation structure 104. Further, a width W1 of the part of the active region 106 located between the bit line trench 108 and the adjacent shallow trench isolation structure 104 along the direction Y is less than or equal to a width W2 of the source region 202 along the direction Y. In the present application, the preparation method of the resistive memory device may be compatible with a preparation method of a DRAM device, that is, at least part of a photomask of the DRAM device may be used to prepare the resistive memory device, such that the resistive memory device has density of the DRAM device while a process procedure of the resistive memory device is simplified, thereby reducing production costs, achieving a high-density array design of the resistive memory device, and enabling a size the resistive memory device to reach 0.004 square microns, which is nearly 19 times smaller.

Figure 3:
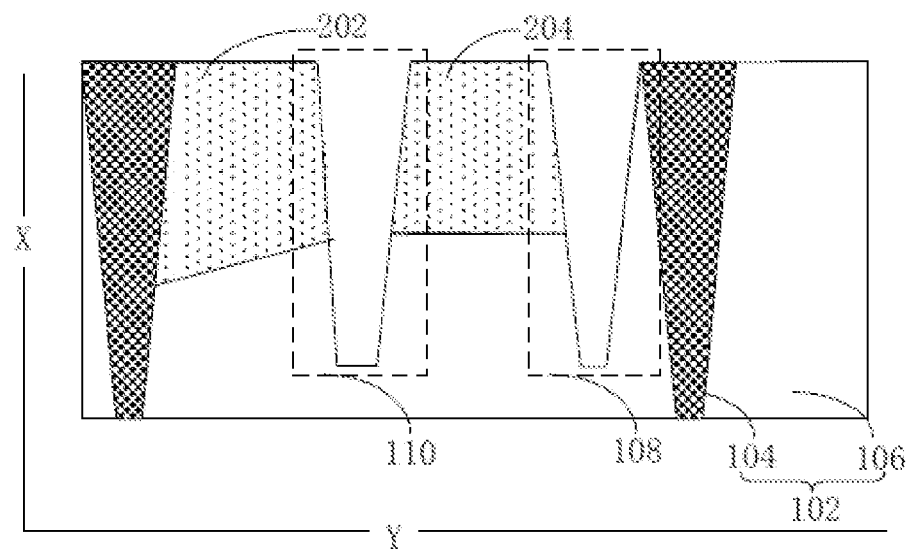
FIG. 3 is a schematic cross-sectional view of a resistive memory device after formation of a gate trench according to another embodiment.

FIG. 3 is a schematic cross-sectional view of a resistive memory device after formation of a gate trench according to another embodiment. Referring to FIG. 3, in this embodiment, when the bit line trench 108 and the gate trench 110 cross the same active region 106, the bit line trench 108 is also in contact with an adjacent shallow trench isolation structure 104 in the direction Y, that is, when one active region 106 has both the is gate trench 110 and the bit line trench 108 passing through it, the active region 106 is divided into two parts: the source region 202 located between the shallow trench isolation structure 104 and the gate trench 110 and the drain region 204 located between the gate trench 110 and the bit line trench 108. Such a setting further reduces the size of the resistive memory device.

In one of the embodiments, the variable resistor structure further includes the drain region 204. That is, the base 102 on the other side of the resistive material layer 206 in the variable resistor structure refers to a drain after doping. In this case, the drain and the bit line structure 210 are respectively used as two electrodes of the variable resistor structure, and the resistive material layer 206 located between the drain and the bit line structure 210 is used as a resistance transition layer between the two electrodes of the variable resistor structure.

In one of the embodiments, the bit line trenches 108 are formed in multiple active regions 106 and the shallow trench isolation structure 104 between adjacent active regions 106. In other embodiments, the bit line trenches 108 are formed only in multiple active regions 106.

Figure 4:
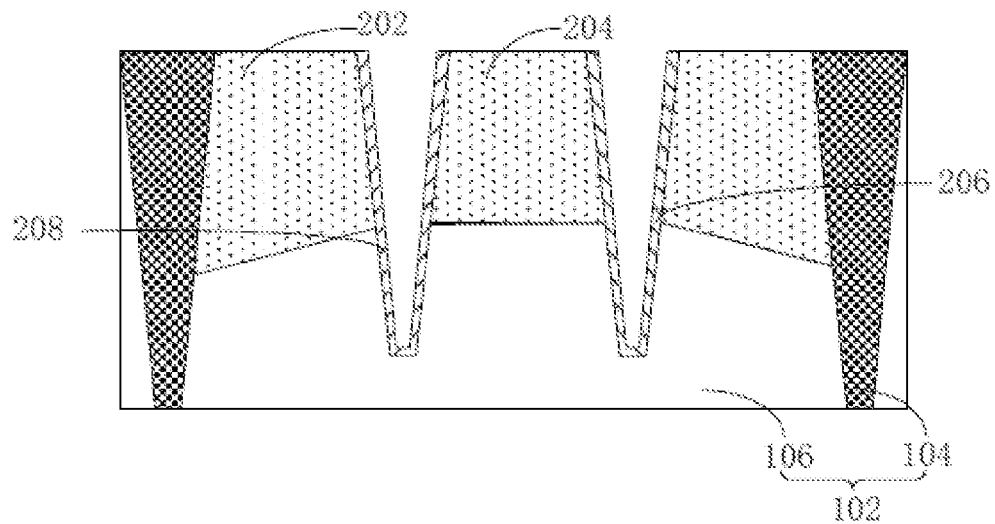
FIG. 4 is a schematic cross-sectional view of a resistive memory device after formation of a first dielectric layer according to an embodiment corresponding to FIG. 2.

FIG. 4 is a schematic cross-sectional view of a resistive memory device after formation of a first dielectric layer 208 according to an embodiment corresponding to FIG. 2. As shown in FIG. 4, in one of the embodiments, during the formation of the resistive material layer 206 on the sidewall and the bottom of each of the bit line trenches 108, a first dielectric layer 208 is formed on a sidewall and the bottom of each of the gate trenches 110. In other embodiments, after the resistive material layer 206 is formed on the sidewall and the bottom of each of the bit line trenches 108 or before the resistive material layer 206 is formed on the sidewall and the bottom of each of the bit line trenches 108, a step of forming a first dielectric layer 208 on a sidewall and the bottom of each of the gate trenches 110 is further included. The formation of the first dielectric layer 208 can isolate the active region 106 from a gate structure 212 subsequently formed in the gate trench 110. The active region 106 includes a source formed in the source region 202 and a drain formed in the drain region 204.

In one of the embodiments, the first dielectric layer 208 at least includes at least one of a hafnium oxide material layer, a silicon dioxide layer, or a tantalum oxide material layer.

In one of the embodiments, the first dielectric layer 208 and the resistive material layer 206 are made of a same material. For example, both are hafnium oxide material layers.

Figure 5:
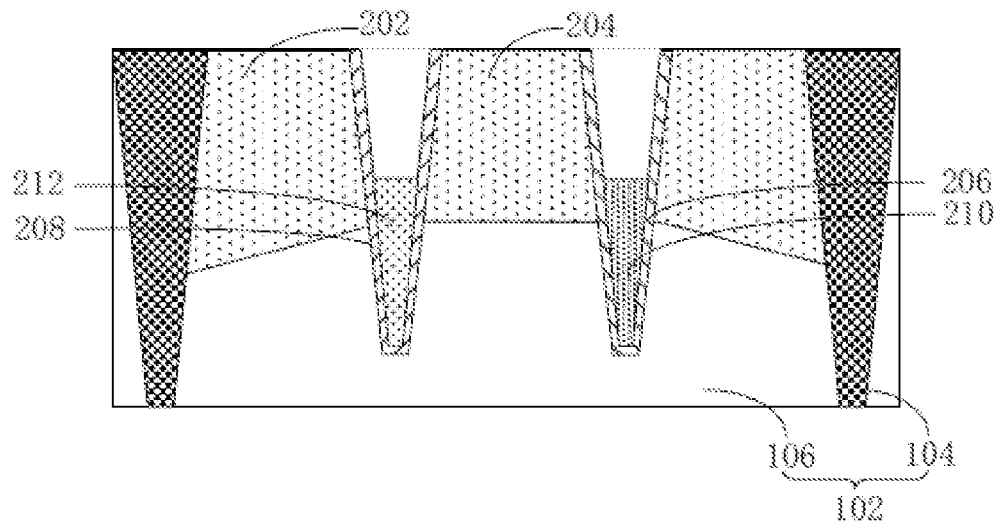
FIG. 5 is a schematic cross-sectional view of a resistive memory device after formation of a gate structure according to an embodiment corresponding to FIG. 4.

FIG. 5 is a schematic cross-sectional view of a resistive memory device after formation of a gate structure 212 according to an embodiment corresponding to FIG. 4. As shown in FIG. 5, in one of the embodiments, during the formation of the bit line structure 210 in each of the bit line trenches 108 through filling, a gate structure 212 is formed in each of the gate trenches 110 through filling. In other embodiments, after the bit line structure 210 is formed in each of the bit line trenches 108 through filling or before the bit line structure 210 is formed in each of the bit line trenches 108 through filling, a step of forming a gate structure 212 in each of the gate trenches 110 through filling is further included.

In one of the embodiments, materials of the bit line structure 210 and the gate structure 212 at least include at least one of a titanium nitride material, a metal titanium material, a tungsten metal material, and a doped polycrystalline silicon material. That the materials of both the bit line structure 210 and the gate structure 212 are titanium nitride is used as an example for description below.

Specifically, during the formation of the bit line structure 210 in each of the bit line trenches 108 through filling, the forming a gate structure 212 in each of the gate trenches 110 through filling includes: Step 1: Form a titanium nitride material layer in the bit line trench 108 and the gate trench 110 through filling by using a deposition process. Step 2: Remove an excess titanium nitride material layer by etching, to obtain the bit line structure 210 consisting of the remaining titanium nitride material layer in the bit line trench 108, and the gate structure 212 consisting of the remaining titanium nitride material layer in the gate trench 110, wherein the gate structure 212 also serves as a word line structure (WL) in the resistive memory device.

In one of the embodiments, an upper surface of the gate structure 212 is flush with an upper surface of the bit line structure 210.

As shown in FIG. 5, in one of the embodiments, the upper surface of the bit line is structure 210 is lower than an upper surface of the base 102, that is, the bit line structure 210 is a buried bit line. In other embodiments, the upper surface of the bit line structure 210 is flush with the upper surface of the base 102 or the upper surface of the bit line structure 210 is higher than the upper surface of the base 102.

Figure 6:
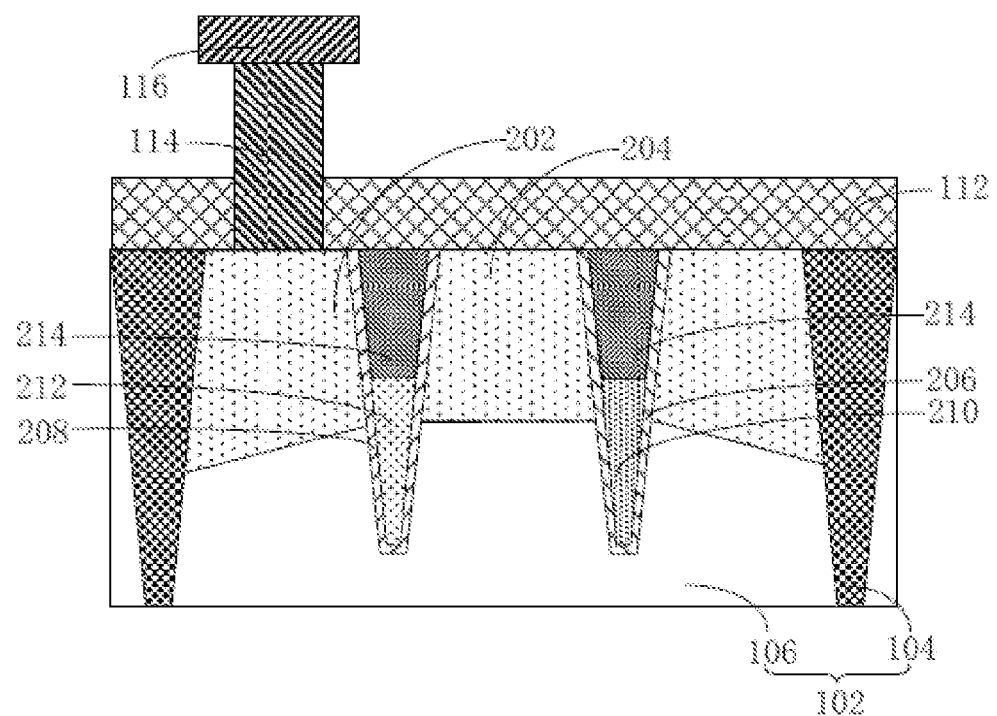
FIG. 6 is a schematic cross-sectional view of a resistive memory device after formation of a second dielectric layer according to an embodiment corresponding to FIG. 5.

FIG. 6 is a schematic cross-sectional view of a resistive memory device after formation of a second dielectric layer 112 according to an embodiment corresponding to FIG. 5. Referring to FIG. 6, in one of the embodiments, the preparation method of the resistive memory device further includes: forming a protective layer 214 on the bit line structure 210 and the gate structure 212. Further, an upper surface of the bit line structure 210 is lower than an upper surface of the base 102, and an upper surface of the protective layer 214 is flush with the upper surface of the base 102 or higher than the upper surface of the base 102. Specifically, first, the bit line trench 108 and the gate trench 110 are filled with a protection material. An upper surface of the protection material is higher than the upper surface of the base 102, and the protection material covers the active region 106 and the shallow trench isolation structure 104. Second, the protection material above a surface of the base 102 is removed by etching. Third, chemical planarization treatment is performed to obtain a protective layer 214 made of the remaining protection material with an upper surface flush with the upper surface of the base 102. A constituent material of the protective layer 214 includes one or more of oxide, nitride, and nitrogen oxide, wherein oxide includes borophosphosilicate glass (BPSG), phosphosilicate glass (PSG), tetraethyl orthosilicate (TEOS), undoped silica glass (USG), spin-coated glass (SOG), high density plasma (HDP), or a spin coated dielectric (SOD); nitride includes silicon nitride (SiN); and nitrogen oxide includes silicon oxynitride (SiON).

Still referring to FIG. 6, in one of the embodiments, after the protective layer 214 is formed on the bit line structure 210 and the gate structure 212, the following is further included: forming a second dielectric layer 112 on the base 102, wherein the second dielectric layer 112 is in contact with the protective layer 214. Further, a constituent material of the second dielectric layer 112 includes one or more of oxide, nitride, and nitrogen oxide, wherein oxide includes borophosphosilicate glass (BPSG), phosphosilicate glass (PSG), tetraethyl orthosilicate (TEOS), undoped silica glass (USG), is spin-coated glass (SOG), high density plasma (HDP), or a spin coated dielectric (SOD); nitride includes silicon nitride (SiN); and nitrogen oxide includes silicon oxynitride (SiON).

In one of the embodiments, the second dielectric layer 112 is located on the upper surface of the base 102. Typically, the second dielectric layer 112 includes a silicon dioxide layer located on the upper surface of the base 102. Further, the second dielectric layer 112 further includes a silicon nitride layer located on an upper surface of the silicon dioxide layer.

In one of the embodiments, the second dielectric layer 112 and the protective layer 214 are made of a same material. In this case, the second dielectric layer 112 may be formed at the same time as the protective layer 214, or may be formed separately from the protective layer 214.

As shown in FIG. 6, in one of the embodiments, after the second dielectric layer 112 is formed on the base 102, the following is further included:

forming a source lead structure 114 on the source region 202, wherein the source lead structure 114 penetrates through the second dielectric layer 112 and is in contact with the source region 202.

Specifically, first, a photoresist layer having a pattern of the source lead structure 114 is formed on an upper surface of the second dielectric layer 112; second, the second dielectric layer 112 is etched by using the photoresist layer as a mask to form a lead trench penetrating through the second dielectric layer 112, and the lead trench exposes the source region 202 under the second dielectric layer 112, that is, the lead trench exposes a doped source in the source region 202; and third, the lead trench is filled with a conductive material to form a source lead structure 114 in contact with the source region 202. Further, the conductive material for forming the source lead structure 114 includes one or more of polycrystalline silicon, metal, conductive metal nitride, conductive metal oxide, and metal silicide, wherein metal may be tungsten (W), nickel (Ni), or titanium (Ti); conductive metal nitride includes titanium nitride (TiN); conductive metal oxide includes iridium oxide (IrO2); and metal silicide includes titanium silicide (TiSi).

In one of the embodiments, an upper surface of the source lead structure 114 is higher than the upper surface of the second dielectric layer 112.

In one of the embodiments, a lower surface of the source lead structure 114 is lower than the upper surface of the base 102 and the lower surface of the source lead structure 114 is not lower than a lower surface of the source.

In another embodiment, the lower surface of the source lead structure 114 is flush with the upper surface of the base 102.

As shown in FIG. 6, in one of the embodiments, after the source lead structure 114 is formed on the source region 202, the following is further included:

forming a source metal wire layer 116 on the base 102, wherein the source metal wire layer 116 is in contact with the source lead structure, for leading the source to an upper surface of the resistive memory device.

Figure 7:
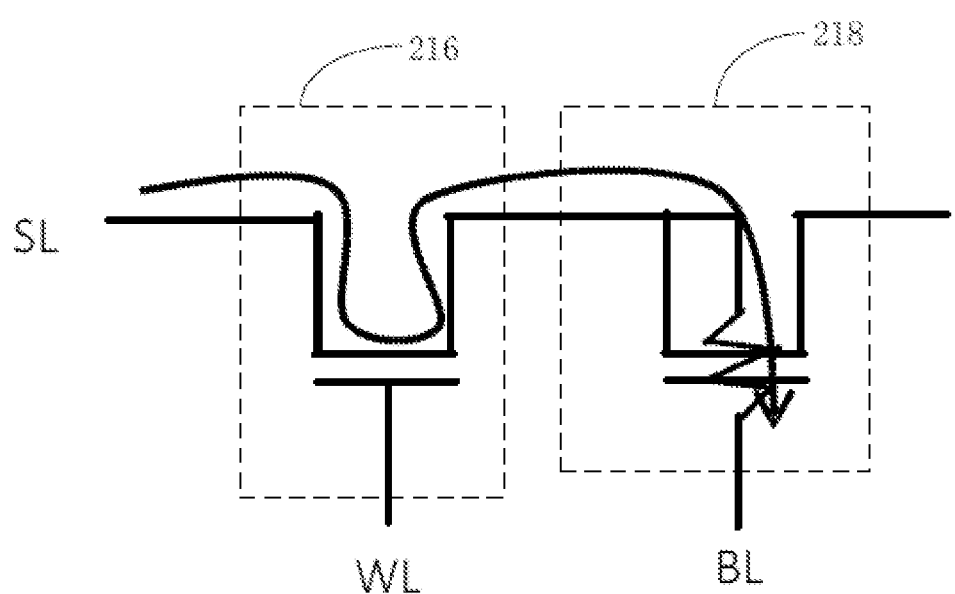
FIG. 7 is a schematic equivalent circuit diagram of a resistive memory device according to an embodiment corresponding to FIG. 6.

FIG. 7 is a schematic equivalent circuit diagram of a resistive memory device according to an embodiment corresponding to FIG. 6. As shown in FIG. 7, an arrowed curve in the figure indicates a flow direction of a current, an input end of the current is a source metal wire layer 116 (SL), and an output end of the current is a bit line structure 210 (BL). The resistive memory device includes a transistor 216 and a variable resistor structure 218. The transistor 216 includes a source region 202, a gate structure 212 (that is, a word line structure WL, the gate structure 212, and a first dielectric layer 208 jointly serve as a gate of the transistor), and a drain region 204. The variable resistor structure 218 includes the drain region 204, a resistive material layer 206 between the drain region 204 and the bit line structure 210, and the bit line structure 210.

It should be understood that although the steps in the flowchart of FIG. 1 are sequentially displayed according to the arrows, these steps are not necessarily performed in the order indicated by the arrows. Unless clearly described otherwise, the execution order of the steps is not strictly limited, and these steps may be executed in other orders. Moreover, at least some of the steps in FIG. 1 may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

As shown in FIG. 2 and FIG. 5, the present application further provides a resistive memory device, including:

a base 102, wherein specifically, the base 102 includes a substrate and different device regions formed on the substrate; and the substrate may be made of undoped monocrystalline silicon, impurity-doped monocrystalline silicon, silicon on insulator (SOI), stacked silicon on insulator (SSOI), stacked silicon-germanium on insulator (S-SiGeOI), silicon-germanium on insulator (SiGeOI), and germanium on insulator (GeOI), or the like, and in an example, in this embodiment, monocrystalline silicon is selected as a constituent material of the substrate;

bit line trenches 108, provided in the base 102;

a resistive material layer 206, located on a sidewall and the bottom of each of the bit line trenches 108, wherein under action of an additional electrical signal such as a voltage or a current, the resistive material layer 206 is reversibly transformed between different resistance states, and the resistance states usually include two types: a high resistance state and a low resistance state; it can be understood that, the resistive material layer 206 may be a high-k material layer; and in one of the embodiments, the resistive material layer 206 includes at least one of a hafnium oxide material layer or a tantalum oxide material layer; and a bit line structure 210, filling each of the bit line trenches 108; wherein a material of the bit line structure 210 may be a titanium nitride material or a tungsten metal material. In this case, the bit line structure 210 on one side of the resistive material layer 206, the base 102 on the other side of the resistive material layer 206, and the resistive material layer 206 jointly form a variable resistor structure (an MIM structure) of the resistive memory device, that is, the bit line structure 210 in the present application also serves as an electrode in the MIM structure and the resistive material layer 206 serves as a resistance transition layer in the MIM structure. This simplifies a process procedure.

In the foregoing resistive memory device, the variable resistor structure includes the bit line structure 210 and the resistive material layer 206. The resistive material layer 206 is located on the sidewall and the bottom of the bit line trench 108, and the bit line structure 210 fills the bit line trench 108. In the resistive memory device of the present application, the bit line structures 210 and the resistive material layer 206 on a bit line sidewall are used as part of the variable resistor structure, and the variable resistor structure is formed during the formation of the bit line structure 210, thereby simplifying a process procedure of the resistive memory device, reducing production costs, and reducing a size of the resistive memory device.

As shown in FIG. 2, in one of the embodiments, the shallow trench isolation structure 104 is formed in the base 102, and the shallow trench isolation structure 104 isolates active regions 106 arranged in an array in the base 102. The resistive memory device further includes:

gate trenches 110, wherein each of the gate trenches 110 and one of the bit line trenches 108 cross a same active region 106 and the active region 106 is divided into a source region 202 located between the gate trench 110 and the shallow trench isolation structure 104 and a drain region 204 located between the gate trench 110 and the bit line trench 108. That is, one active region 106 has both the gate trench 110 and the bit line trench 108 passing through it, and the active region 106 is divided into the source region 202 located between the shallow trench isolation structure 104 and the gate trench 110 and the drain region 204 located between the gate trench 110 and the bit line trench 108. Subsequently, a doping process may be performed on the source region 202 and the drain region 204 according to actual needs, to respectively obtain a source and a drain of a transistor in the resistive memory device.

In one of the embodiments, a doping depth of each of the source and the drain along a direction X is less than or equal to a depth of each of the gate trench 110 and the bit line trench 108. The direction X refers to a direction upward from the base 102. A direction Y refers to a direction intersecting with an extension direction of the bit line trench 108.

Still referring to FIG. 2, in one of the embodiments, the bit line trench 108 and the gate trench 110 have a same depth in the direction X and a same width in the direction Y. In this case, the bit line trench 108 and the gate trench 110 may be formed by photolithography devices having a same overlay error. In other embodiments, the bit line trench 108 and the gate trench 110 have different shapes. In this case, the bit line trench 108 and the gate trench 110 are formed according to process requirements by photolithography devices having a same overlay error or different overlay errors.

As shown in FIG. 2, in one of the embodiments, while the bit line trench 108 and the gate trench 110 cross the same active region 106, there is an active region 106 between the bit line trench 108 and an adjacent shallow trench isolation structure 104 in the direction Y, that is, when one active region 106 has both the gate trench 110 and the bit line trench 108 passing through it, the active region 106 is divided into the source region 202 located between the shallow trench isolation structure 104 and the gate trench 110, the drain region 204 located between the gate trench 110 and the bit line trench 108, and part of the active region 106 located between the bit line trench 108 and the adjacent shallow trench isolation structure 104. Further, a width W1 of the part of the active region 106 located between the bit line trench 108 and the adjacent shallow trench isolation structure 104 along the direction Y is less than or equal to a width W2 of the source region 202 along the direction Y. In the present application, the preparation method of the resistive memory device may be compatible with a preparation method of a DRAM device, that is, at least part of a photomask of the DRAM device may be used to prepare the resistive memory device, such that the resistive memory device has density of the DRAM device while a process procedure of the resistive memory device is simplified, thereby reducing production costs, achieving a high-density array design of the resistive memory device, and enabling a size the resistive memory device to reach 0.004 square microns, which is nearly 19 times smaller.

Referring to FIG. 3, in other embodiments, when the bit line trench 108 and the gate trench 110 cross the same active region 106, the bit line trench 108 is also in contact with an adjacent shallow trench isolation structure 104 in the direction Y, that is, when one active region 106 has both the gate trench 110 and the bit line trench 108 passing through it, the active region 106 is divided into two parts: the source region 202 located between the shallow trench isolation structure 104 and the gate trench 110 and the drain region 204 located between the gate trench 110 and the bit line trench 108. Such a setting further reduces the size of the resistive memory device.

In one of the embodiments, the variable resistor structure further includes the drain region 204. That is, the base 102 on the other side of the resistive material layer 206 in the variable resistor structure refers to a drain after doping. In this case, the drain and the is bit line structure 210 are respectively used as two electrodes of the variable resistor structure, and the resistive material layer 206 located between the drain and the bit line structure 210 is used as a resistance transition layer between the two electrodes of the variable resistor structure.

In one of the embodiments, the bit line trenches 108 are formed in multiple active regions 106 and the shallow trench isolation structure 104 between adjacent active regions 106. In other embodiments, the bit line trenches 108 are formed only in multiple active regions 106.

As shown in FIG. 4, in one of the embodiments, the resistive memory device further includes:
a first dielectric layer 208, located between the gate structure 212 and a sidewall of the gate trench 110 and between the gate structure 212 and the bottom of the gate trench 110. The formation of the first dielectric layer 208 can isolate the active region 106 from a gate structure 212 subsequently formed in the gate trench 110. The active region 106 includes a source formed in the source region 202 and a drain formed in the drain region 204.

In one of the embodiments, the first dielectric layer 208 at least includes at least one of a hafnium oxide material layer, a silicon dioxide layer, or a tantalum oxide material layer.

In one of the embodiments, the first dielectric layer 208 and the resistive material layer 206 are made of a same material. For example, both are hafnium oxide material layers. Further, the first dielectric layer 208 and the resistive material layer 206 are simultaneously formed.

As shown in FIG. 5, in one of the embodiments, the resistive memory device further includes: a gate structure 212, filling the gate trench 110. The gate structure 212 also serves as a word line structure (WL) of the resistive memory device. In one of the embodiments, materials of the bit line structure 210 and the gate structure 212 at least include at least one of a titanium nitride material, a metal titanium material, a tungsten metal material, and a doped polycrystalline silicon material.

In one of the embodiments, an upper surface of the gate structure 212 is flush with an upper surface of the bit line structure 210.

As shown in FIG. 5, in one of the embodiments, the upper surface of the bit line structure 210 is lower than an upper surface of the base 102, that is, the bit line structure 210 is a buried bit line. In other embodiments, the upper surface of the bit line structure 210 is flush with the upper surface of the base 102 or the upper surface of the bit line structure 210 is higher than the upper surface of the base 102.

As shown in FIG. 6, in one of the embodiments, the resistive memory device further includes: a protective layer 214, located on the bit line structure 210 and the gate structure 212. Further, an upper surface of the bit line structure 210 is lower than an upper surface of the base 102, and an upper surface of the protective layer 214 is flush with the upper surface of the base 102 or higher than the upper surface of the base 102. A constituent material of the protective layer 214 includes one or more of oxide, nitride, and nitrogen oxide, wherein oxide includes borophosphosilicate glass (BPSG), phosphosilicate glass (PSG), tetraethyl orthosilicate (TEOS), undoped silica glass (USG), spin-coated glass (SOG), high density plasma (HDP), or a spin coated dielectric (SOD); nitride includes silicon nitride (SiN); and nitrogen oxide includes silicon oxynitride (SiON).

Still referring to FIG. 6, in one of the embodiments, the resistive memory device further includes:
a second dielectric layer 112, located on the base 102 and in contact with the protective layer 214. Further, a constituent material of the second dielectric layer 112 includes one or more of oxide, nitride, and nitrogen oxide, wherein oxide includes borophosphosilicate glass (BPSG), phosphosilicate glass (PSG), tetraethyl orthosilicate (TEOS), undoped silica glass (USG), spin-coated glass (SOG), high density plasma (HDP), or a spin coated dielectric (SOD); nitride includes silicon nitride (SiN); and nitrogen oxide includes silicon oxynitride (SiON).

In one of the embodiments, the second dielectric layer 112 is located on the upper surface of the base 102. Typically, the second dielectric layer 112 includes a silicon dioxide layer located on the upper surface of the base 102. Further, the second dielectric layer 112 further includes a silicon nitride layer located on an upper surface of the silicon dioxide layer.

In one of the embodiments, the second dielectric layer 112 and the protective layer 214 are made of a same material.

Still referring to FIG. 6, in one of the embodiments, the resistive memory device further includes: a source lead structure 114, located on the source region 202, wherein the source lead structure 114 penetrates through the second dielectric layer 112 and is in contact with the source region 202. Further, the conductive material for forming the source lead structure 114 includes one or more of polycrystalline silicon, metal, conductive metal nitride, conductive metal oxide, and metal silicide, wherein metal may be tungsten (W), nickel (Ni), or titanium (Ti); conductive metal nitride includes titanium nitride (TiN); conductive metal oxide includes iridium oxide (IrO2); and metal silicide includes titanium silicide (TiSi). The source lead structure 114 is in contact with a doped source in the source region 202.

In one of the embodiments, an upper surface of the source lead structure 114 is higher than the upper surface of the second dielectric layer 112.

In one of the embodiments, a lower surface of the source lead structure 114 is lower than the upper surface of the base 102 and the lower surface of the source lead structure 114 is not lower than a lower surface of the source.

In another embodiment, the lower surface of the source lead structure 114 is flush with the upper surface of the base 102.

Still referring to FIG. 6, in one of the embodiments, the resistive memory device further includes:
a source metal wire layer 116, located on the base 102 and in contact with the source lead structure, for leading the source to an upper surface of the resistive memory device.

FIG. 7 is a schematic equivalent circuit diagram of a resistive memory device according to an embodiment corresponding to FIG. 6. As shown in FIG. 7, an arrowed curve in the figure indicates a flow direction of a current, an input end of the current is a source metal wire layer 116 (SL), and an output end of the current is a bit line structure 210 (BL). The resistive memory device includes a transistor 216 and a variable resistor structure 218. The transistor 216 includes a source region 202, a gate structure 212 (that is, a word line structure WL, the gate structure 212, and a first dielectric layer 208 jointly serve as a gate of the transistor), and a drain region 204. The variable resistor structure 218 includes the drain region 204, a resistive material layer 206 between the drain region 204 and the bit line structure 210, and the bit line structure 210.

In one of the embodiments, the resistive memory device is made by using any one of the foregoing preparation methods of the resistive memory device.

The present application further provides a storage device. The storage device includes any one of the foregoing resistive memory devices.

The technical features of the foregoing embodiments can be employed in arbitrary combinations. For brevity of description, not all possible combinations of the technical features of the foregoing embodiments are described. However, the combinations of the technical features should be construed as falling within the scope described in this specification as long as there is no contradiction in the combinations.

Only several embodiments of the present application are described in detail above, but they should not be construed as limiting the patent scope of the present application. It should be noted that those of ordinary skill in the art can further make several variations and improvements without departing from the idea of the embodiments of the present application. These variations and improvements all fall within the protection scope of the embodiments of the present application. Therefore, the protection scope of the embodiments of the present application should be subject to the protection scope defined by the appended claims.

The invention claimed is:

1. A preparation method of a resistive memory device, comprising:
    providing a base, wherein a shallow trench isolation structure is formed in the base, and the shallow trench isolation structure isolates active regions arranged in an array in the base;
    forming bit line trenches and gate trenches in the base, each of the gate trenches and one of the bit line trenches cross a same active region, and the active region is divided into a source region located between the gate trench and the shallow trench isolation structure, and a drain region located between the gate trench and the bit line trench;
    forming a resistive material layer on a sidewall and a bottom of each of the bit line trenches; and
    forming a bit line structure in each of the bit line trenches and a gate structure in each of the gate trenches through filling, wherein a variable resistor structure comprises the bit line structure and the resistive material layer;
    forming a source lead structure on the source region;
    forming a source metal wire layer on the base, wherein the source metal wire layer is in contact with the source lead structure.

2. The preparation method according to claim 1, wherein the resistive material layer comprises at least one of a hafnium oxide material layer or a tantalum oxide material layer.

3. The preparation method according to claim 1, wherein an upper surface of the bit line structure is lower than an upper surface of the base.

4. The preparation method according to claim 1, wherein during the forming a resistive material layer on a sidewall and a bottom of each of the bit line trenches, a first dielectric layer is formed on a sidewall and a bottom of each of the gate trenches.

5. The preparation method according to claim 4, wherein the first dielectric layer and the resistive material layer are made of a same material.

6. The preparation method according to claim 1, wherein an upper surface of the gate structure is flush with an upper surface of the bit line structure.

7. The preparation method according to claim 1, further comprising:
    forming a protective layer on the bit line structure and the gate structure, wherein the protective layer is flush with an upper surface of the base; and
    forming a second dielectric layer on the base, wherein the second dielectric layer is in contact with the protective layer.

8. The preparation method according to claim 7, wherein the source lead structure penetrates through the second dielectric layer and is in contact with the source region.

9. The preparation method according to claim 1, wherein under action of an additional electrical signal comprising a current, the resistive material layer is reversibly transformed between different resistance states, and the resistance states comprising two types: a high resistance state and a low resistance state, the source metal wire layer is an input end of the current, and the bit line structure is an output end of the current.

10. The preparation method according to claim 1, wherein the bit line trench and the gate trench have a same depth in a direction X upward from the base and a same width in a direction Y intersecting with an extension direction of the bit line trench.

11. A resistive memory device, comprising:
    a base, wherein a shallow trench isolation structure is formed in the base, and the shallow trench isolation structure isolates active regions arranged in an array in the base;
    bit line trenches and gate trenches, provided in the base, each of the gate trenches and one of the bit line trenches cross a same active region, and the active region is divided into a source region located between the gate trench and the shallow trench isolation structure, and a drain region located between the gate trench and the bit line trench;
    a resistive material layer, located on a sidewall and a bottom of each of the bit line trenches;
    a bit line structure, filling each of the bit line trenches, wherein a variable resistor structure comprises the bit line structure and the resistive material layer;
    a gate structure, filling in each of the gate trenches;
    a source lead structure, located on the source region; and
    a source metal wire layer on the base, wherein the source metal wire layer is in contact with the source lead structure.

12. The resistive memory device according to claim 11, wherein the resistive material layer comprises at least one of a hafnium oxide material layer or a tantalum oxide material layer.

13. The resistive memory device according to claim 11, wherein an upper surface of the bit line structure is lower than an upper surface of the base.

14. The resistive memory device according to claim 11, wherein
    the variable resistor structure further comprises the drain region.

15. The resistive memory device according to claim 14, further comprising:

a first dielectric layer, located between the gate structure and a sidewall of the gate trench and between the gate structure and a bottom of the gate trench.

16. The resistive memory device according to claim 15, wherein the first dielectric layer and the resistive material layer are made of a same material.

17. The resistive memory device according to claim 14, further comprising:
   a protective layer, located on the bit line structure and the gate structure, wherein the protective layer is flush with an upper surface of the base;
   a second dielectric layer, located on the base and in contact with the protective layer; and
   a source lead structure, located on the source region, wherein the source lead structure penetrates through the second dielectric layer and is in contact with the source region.

18. The resistive memory device according to claim 11, wherein under action of an additional electrical signal comprising a current, the resistive material layer is reversibly transformed between different resistance states, and the resistance states comprising two types: a high resistance state and a low resistance state, the source metal wire layer is an input end of the current, and the bit line structure is an output end of the current.

19. The resistive memory device according to claim 11, wherein the bit line trench and the gate trench have a same depth in a direction X upward from the base and a same width in a direction Y intersecting with an extension direction of the bit line trench.

* * * * *